US006064000A

United States Patent [19]

Kim

[11] Patent Number: 6,064,000

[45] **Date of Patent: *May 16, 2000**

[54] HEAT SHRINKABLE SHIELDING TUBE

[75] Inventor: Sun Ki Kim, Anayang, Rep. of Korea

[73] Assignee: The Zippertubing Company, Los Angeles, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/564,498

[22] Filed: Nov. 29, 1995

Related U.S. Application Data

[63] Continuation of application No. 08/421,755, Apr. 14, 1995, abandoned.

[60] Provisional application No. 60/007,308, Nov. 6, 1995.

[30] Foreign Application Priority Data

Mar. 18, 1995 [KR] Rep. of Korea ........................ 95-5725

[51] Int. Cl.$^{7}$ ........................................................ H05K 9/00

[52] U.S. Cl. ...................... 174/36; 174/109; 174/DIG. 8; 138/138

[58] Field of Search ............................ 174/DIG. 8, 35 R, 174/35 MS, 78, 36, 74 A, 93, 109; 361/816, 818; 138/138; 264/230; 428/34.9, 913

[56] References Cited

U.S. PATENT DOCUMENTS

| | | | |
|---|---|---|---|
| 4,555,422 | 11/1985 | Nakamura et al. | 428/36 |
| 4,559,973 | 12/1985 | Hane et al. | 138/138 |
| 4,598,165 | 7/1986 | Tsai | 174/36 |
| 4,678,699 | 7/1987 | Kritchevsky et al. | 428/175 |
| 4,735,833 | 4/1988 | Chiotis et al. | 428/35 |
| 4,803,103 | 2/1989 | Pithouse et al. | 428/34.5 |
| 4,822,952 | 4/1989 | Katz et al. | 428/34.9 |
| 4,865,892 | 9/1989 | Winfield et al. | 174/73.1 |
| 4,992,624 | 2/1991 | Benson et al. | 174/35 R |
| 5,096,206 | 3/1992 | Andre et al. | 277/1 |
| 5,098,753 | 3/1992 | Gregory et al. | 428/34.9 |
| 5,302,428 | 4/1994 | Steele et al. | 428/34.9 |
| 5,367,123 | 11/1994 | Plummer, III et al. | 174/36 |
| 5,391,836 | 2/1995 | Bortas et al. | 174/36 |
| 5,501,679 | 3/1996 | Krueger et al. | 604/393 |
| 5,521,331 | 5/1996 | Hillburn | 174/36 |

FOREIGN PATENT DOCUMENTS

| | | |
|---|---|---|
| 57-43160 | 8/1955 | Japan . |
| 63-50199 | 4/1988 | Japan . |
| 63-239517 | 9/1990 | Japan . |
| 6-218873 | 8/1994 | Japan . |
| WO93/15872 | 8/1993 | WIPO . |

*Primary Examiner*—Kristine Kincaid
*Assistant Examiner*—Hung V Ngo
*Attorney, Agent, or Firm*—Christie, Parker & Hale, LLP

[57] ABSTRACT

A heat shrinkable shielding tube and a manufacturing method thereof employ an electromagnetic wave shielding material inserted into a heat shrinkable tube and adhered lengthwise thereto. A metallized fabric electromagnetic shielding material may be adhesively bonded inside the tube with a longitudinal stripe of adhesive. The longitudinal edges of the electromagnetic shielding material overlap to prevent electromagnetic leakage. Electrical wires or cables to be shielded are inserted into the shielding tube, and upon heating, the tube tightly engages the wires and provides effective electromagnetic shielding. The heat shrinkable shielding tube provides an outstanding effect in shielding electromagnetic wave radiation, and because the construction and manufacturing processes are flexible, it can also significantly reduce production costs.

5 Claims, 8 Drawing Sheets

HEAT SHRINKABLE SHIELDING TUBE

This application claims benefit of Provisional Appln. No. 60/007,308 filed Nov. 6, 1995. This is a continuation of application Ser. No. 08/421,755 filed Apr. 14, 1995, now abandoned.

BACKGROUND

The present invention relates to a heat shrinkable shielding tube for shielding electrical wires from external electromagnetic radiation and preventing such radiation generated by the wires from emanating outside of the shielding tube.

This invention pertains to an electromagnetic shielding tube which can be easily fitted around an electric wire or bundle of wires and fixed thereto by a heating process.

A heat shrinkable tube is a rubber or plastic tube which shrinks in all dimensions when exposed to heat. Such tubes are used to protect or fix electric wires or cables inserted within the tube. The tube generally has a seamless tubular shape. The tubes are made of material such as polyolefin, Teflon or polyvinyl chloride (PVC). When an electric wire or cable is inserted into the shielding tube and heat is applied, the tube constricts, causing the inner surface of the tube to tightly engage the outside surface of the electric wires within in order to protect and fix them.

However, such heat shrinkable tubes do not effectively prevent the electromagnetic radiation generated by a current flowing in the contained electric wires from emanating from the tube nor do they prevent electromagnetic radiation generated externally from penetrating the heat shrinkable tube which can affect the electrical performance of the contained wires. Such electromagnetic interference can create problems in electronic appliances or telecommunication products sensitive to electromagnetic radiation, possibly causing the products to operate erroneously or reduce their sensitivity.

Previously, a common approach was to spirally wrap a tape made from an electromagnetic shielding material around the outside surface of the electric wires to be shielded. The electric wire wound by the shielding material was then inserted into the heat shrinkable tube. When heat was applied, the heat shrinkable tube constricted around the tape shielded wires, thereby fixing the wires and their shielding.

There are still several problems with this approach. Wrapping the wires with an electromagnetically shielding tape is a relatively time consuming and complex operation. Also, such a configuration requires a certain amount of overlapping of the electromagnetic shielding material, which raises the material costs for the shielding. In addition, it is difficult to obtain a uniform shielding affect from this method of shielding.

SUMMARY OF THE INVENTION

The present invention discloses a solution to the aforementioned problems by providing a heat shrinkable shielding tube, and a method for manufacture thereof, with an integrated electromagnetic shielding layer. The advantage of such an invention is that the contained wires are automatically shielded and fixed upon heating and shrinking the heat shrinkable outer tube.

A heat shrinkable tube is obtained by melting and extruding a rubber or plastic material such as polyethylene, polyvinyl chloride or polyester in a tubular form. The obtained tube may be irradiated with an electron beam, thereby crosslinking the material. The crosslinked tube is then stretched at a temperature lower than the melting point of the material, but higher than its softening point. Upon heating, a heat shrinkable tube prepared in this manner is capable of returning to its original shape prior to stretching. Such a tube may be used to form a tight rubber or plastic covering on a desired object, such as a bundle of electric wires.

According to the present invention, a base tube is first inserted into a funnel assembly. The funnel assembly consists of two funnel members, each with a front funnel portion and a rear cylindrical portion. The first funnel member fits inside the second funnel member such that a gap exists between the outer surfaces of the first funnel member and the interior surface of the second funnel member. A base tube is passed through the inner diameter of the first funnel member. At the same time, a sheet of electromagnetic shielding material is passed through the gap between the two funnel members, causing it to acquire the cylindrical shape of the rear portions of the funnel members as it passes through the rear of the funnel assembly.

The base tube is slid within the sheet as it exits the funnel assembly, causing it to maintain its cylindrical shape. The front portion of the sheet extends beyond the front end of the base tube. This portion is heat pressed, which temporarily fixes the sheet to the base tube. An adhesive coating is then applied to the exterior surface of the sheet with a brush or other coating means. The internal surface of the heat shrinkable tube may also be coated with an adhesive. The base tube and sheet assembly is then inserted through the heat shrinkable tube. Pressure is applied to the exterior surface of the heat shrinkable tube to ensure contact between the adhesive coating on the sheet and the interior of the tube. Once the adhesive has dried or cured, the base tube is extracted from the heat shrinkable tube and attached shielding material. Finally, the excess portions of the shielding material protruding beyond the ends of the heat shrinkable tube are cut away.

An electric wire to be shielded may be inserted into the resulting heat shrinkable shielding tube. Once heat is applied, the tube and attached shielding layer will constrict, forming a tight covering over the electric wire and providing effective electromagnetic shielding.

DESCRIPTION

Figure 1A:
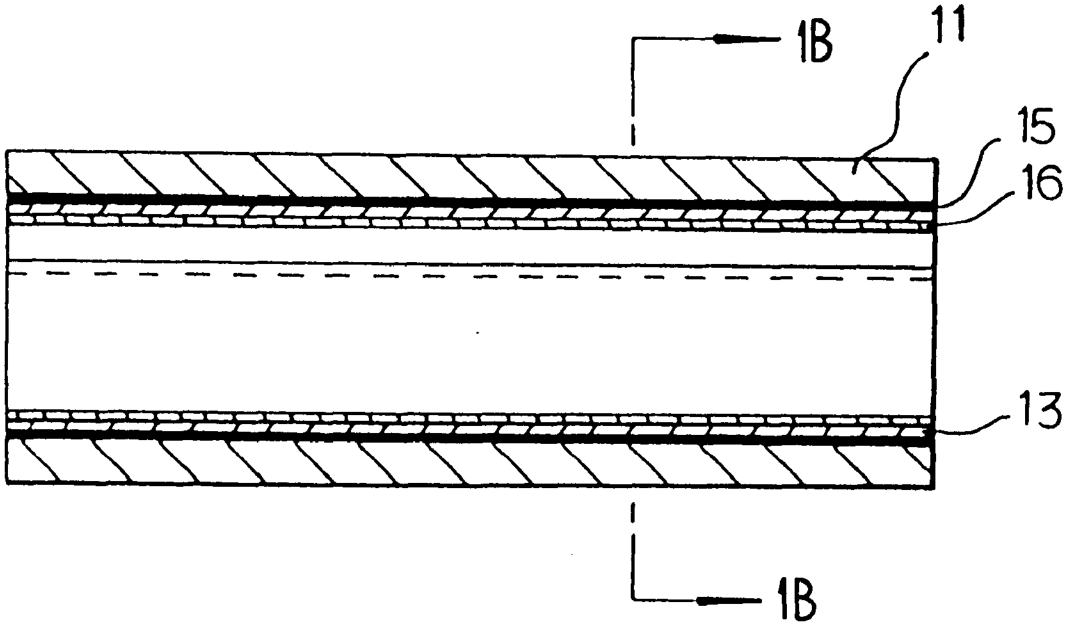
FIG. 1A is a longitudinal sectional view according to one embodiment of the heat shrinkable shielding tube.
Figure 1B:
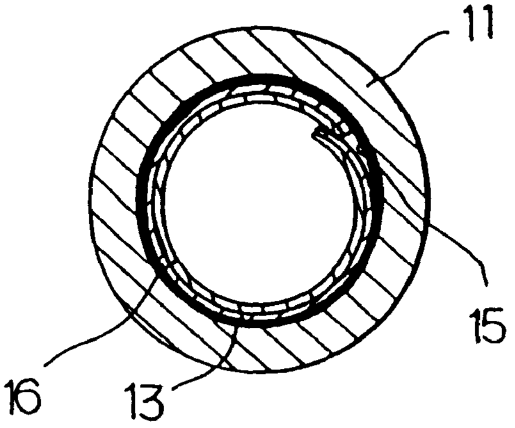
FIG. 1B is a cross-sectional view along the plane "A—A" in FIG. 1A.
Figure 2A:
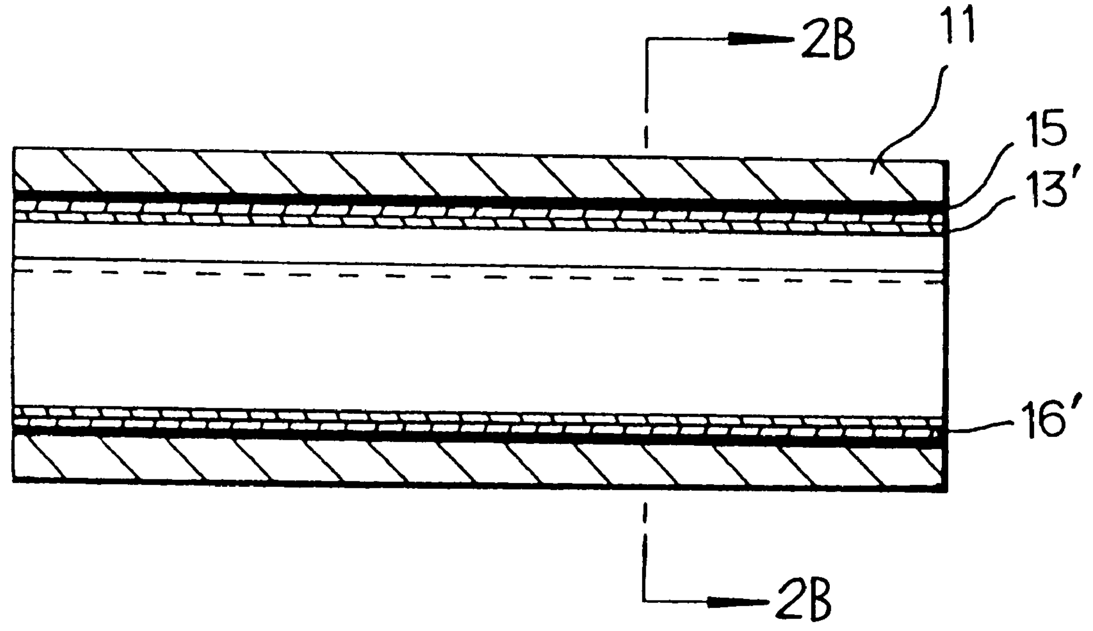
FIG. 2A is a longitudinal sectional view according to another embodiment of the heat shrinkable shielding tube.
Figure 2B:
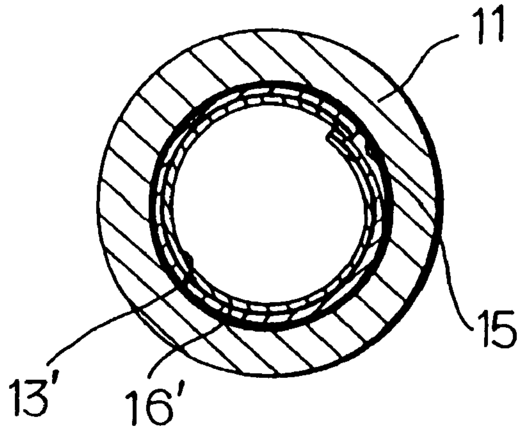
FIG. 2B is a cross-sectional view along plane "B—B" in FIG. 2A.

As shown in FIGS. 1 and 2, a sheet of electromagnetic shielding material 13, in this case a metal foil, is attached to the interior of the heat shrinkable shielding tube 11 by means of an adhesive 15 distributed lengthwise along the tube 11. The sheet of shielding material 13 is wider than the internal circumference of the tube so that the two longitudinal edges of the shielding material overlap along the length of the tube 11 so that there is continuous electrical shielding around the entire internal circumference of the tube. If desired, at least one side of the foil 13 is coated with a layer of semiconducting or insulating material 16 such as polyester, polyethylene or PVC.

Alternatively, a metallized fabric such as polyester fiber, nylon fiber or non-woven fabric coated with a conductive metal such as aluminum, copper or nickel can be used as the shielding material 13. Such metallized fabric is thin, flexible and readily commercially available. Electromagnetic shielding material may also be a sheet of plastic metallized on one or both faces to be electrically conductive.

In another embodiment of the present invention, a seamed cylindrical tube made by fusing or otherwise joining the longitudinal edges of a sheet of electromagnetic shielding material is inserted into the tube 11 and adhered to the inner surface of the tube by the adhesive 15 instead of a loosely rolled sheet of shielding material 13.

When the electric wire is inserted into the heat shrinkable shielding tube and heat is applied, the heat shrinkable shielding tube is shrunk, adhering the shielding material at the inside surface thereof tightly to the electric wire, so that the electromagnetic waves are effectively shielded by the shielding material 13.

Figure 5:
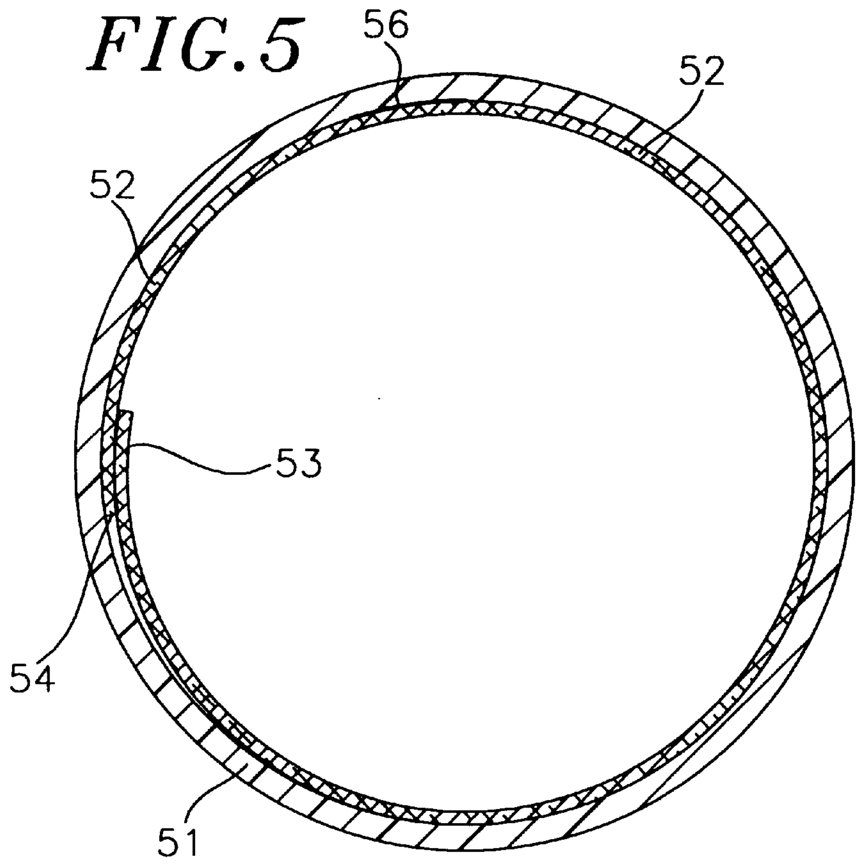
FIG. 5 is a cross-sectional view of another embodiment of the heat shrinkable shielding tube.

Still another embodiment of the present invention employs a heat shrinkable tube 51 as illustrated in transverse cross section in FIG. 5. The inside of the plastic tube may be coated with a layer of metal or have flexible foil bonded thereto to provide electrical shielding. Alternatively, the inside of the plastic tube may be bare.

Within the heat shrinkable tube 51 there is a layer of electrically conductive fabric 52 such as metallized synthetic fiber cloth available from Monsanto Company. A narrow band of adhesive 56 bonds a portion, preferably not an edge portion 54, of the conductive fabric to the inside of the heat shrinkable tube 51. The balance of the width of the fabric sheet is not connected to the inside of the heat shrinkable plastic tube. The edges of the fabric overlap so that there is a continuous electrically conductive layer inside the heat shrinkable tube.

Figure 6:
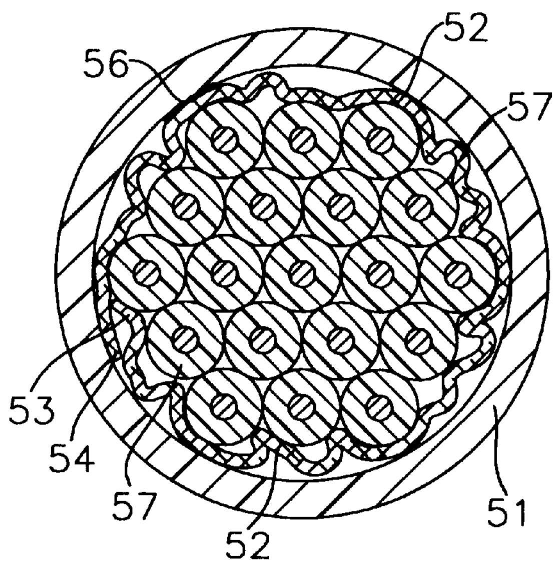
FIG. 6 is a cross-section of a fully assembled and heat shrunk shielded wire assembly according to one embodiment of the invention.

As a consequence, when the outer heat shrinkable tube shrinks around a bundle of insulated wires 57, for example, the conductive fabric is free to buckle and fold in a random manner as illustrated in the transverse cross-section of FIG. 6. Since the conductive fabric is quite flexible and soft, it can readily fold into approximately 180° turns and buckle to fit in between the wires and the surrounding shrunk plastic tube. The free buckling and folding of the flexible conductive fabric permits the heat shrinkable tube to shrink tightly around the bundle of wires and give a smooth uniform external surface. The free buckling and folding of the flexible fabric also maintains the area of overlap between the edges of the conductive fabric, thereby minimizing leakage of electromagnetic radiation.

Figure 7:
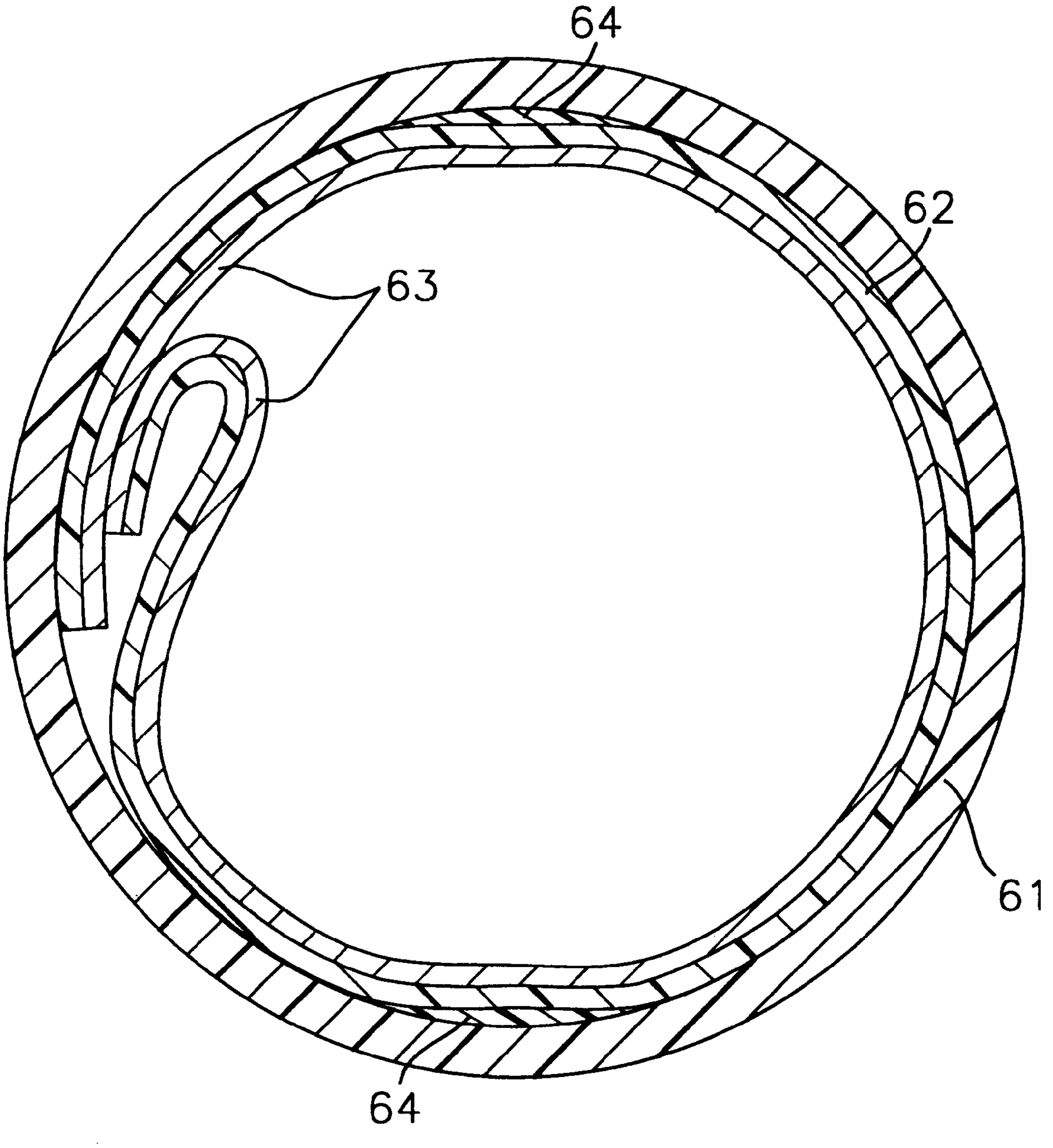
FIG. 7 is a cross-sectional view of yet another embodiment of the heat shrinkable shielding tube.

FIG. 7 illustrates another embodiment of heat shrinkable tubing 61 with electrical shielding 62 on the inside. In this embodiment the electrical shielding is provided by a sheet of metallized plastic 62. The sheet has a layer of metal deposited on its inside face. For best electrical shielding, there should be no gaps in the conductive layer inside the tube. Thus, an edge portion of the plastic sheet is folded back on itself so that along the overlap of the edges of the plastic sheet, the metal layer on the inside face of the sheet is in electrical contact with the metal layer on the folded back portion of the opposite edge.

Figure 3A:
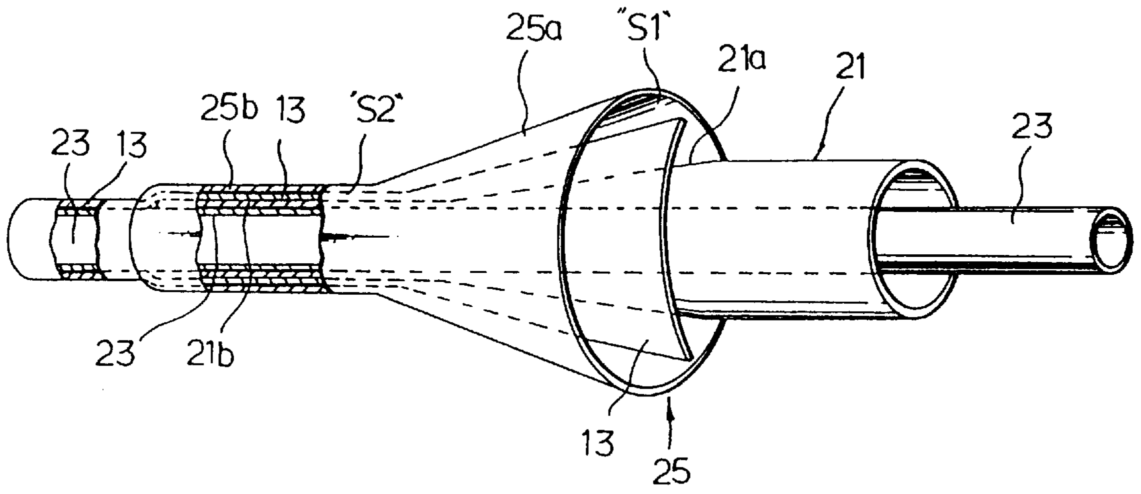
FIG. 3A is an exploded view of the funnel assembly.

A funnel assembly, as illustrated in FIG. 3A, is used to form the sheet of electromagnetic shielding material into a cylindrical shape. The funnel assembly consists of a first funnel member 21 and a second funnel member 25 having respective funnel portions 21*a* and 25*a* and cylindrical portions 21*b* and 25*b*. The first funnel member 21 is disposed within the second funnel member 25 such that the funnel portions and cylindrical portions of each funnel member are adjacent to corresponding portion of the other funnel member.

A first space S1 of conical shape is formed between the exterior surface of the funnel portion 21*a* of the first funnel member 21 and the inside surface of the funnel portion 25*a* of the second funnel member 25. The angle of the funnel portion 21*a* of the first funnel member 21 is less acute than that of the funnel portion 25*a* of the second funnel member 25, so that the cross sectional area of the first space S1 decreases as it approaches the interface between the cylindrical and funnel portions of the funnel members. A second space S2 of constant surface area exists between the cylindrical portions 21*b* and 25*b* of the funnel members 21 and 25.

As a base tube 23 is inserted into a first funnel member 21, a sheet of shielding material 13 is inserted into the space S1 between the first funnel member 21 and the second funnel member 25. As the shielding material 13 passes through the funnel assembly, it is wrapped into a cylindrical shape. As the shielding material 13 exits the funnel assembly, the base tube 23 is passed through the first funnel such that it exits within the rolled sheet of electromagnetic shielding material 16 to maintain its shape.

Figure 3B:
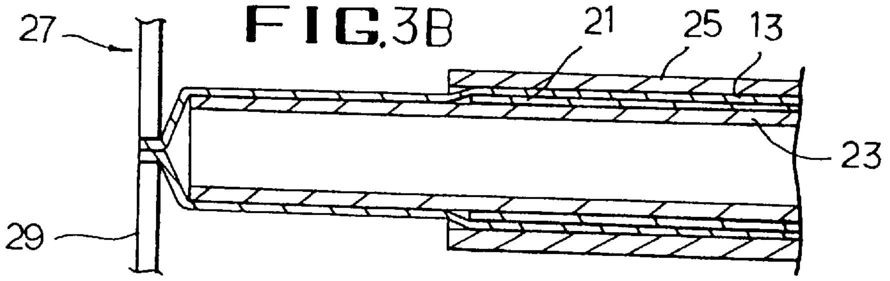
FIG. 3B is a representation of the temporary fixing means according to one embodiment of the invention.

The base tube 23 fits into the rolled shield material 16 such that a portion of the shielding material extends beyond the end of the base tube. This portion of shielding material is used to fix the shield material 16 to the base tube 23 using a fixing means 27 as illustrated in FIG. 3B. One means of fixing the shield material to the base tube is by applying a thermal pressing process to the ends of the shield material, thereby tightening the material over the base tube 23.

Figure 4:
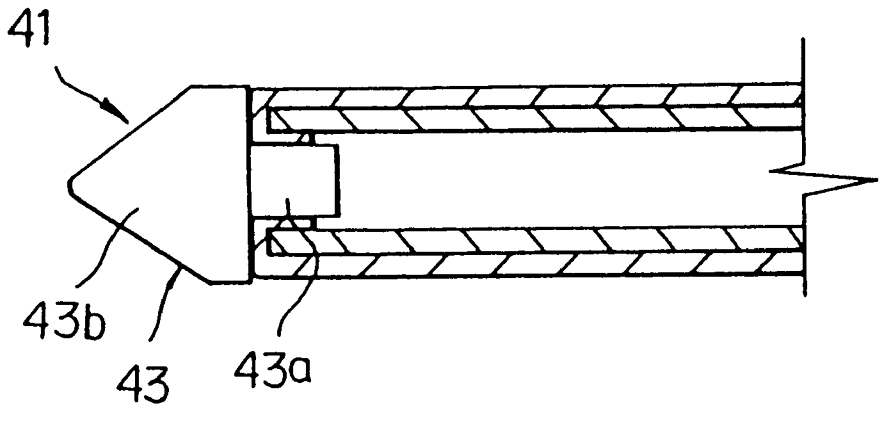
FIG. 4 is a representation of a temporary fixing means according to another embodiment of the present invention.

Another means of temporarily fixing the shielding material 16 to the base tube 23 is by utilizing a clamping device 43 as illustrated in FIG. 4. The clamping device 43 includes an insertion portion 43*a* having an outer diameter approximately the same size as the inner diameter of the base tube 23 and a head portion 43*b* having a larger outer diameter than the base tube 23. When the shielding material 13 is folded inside the front end of the base tube 23 and the insertion portion 43*a* is inserted, it forms a tight fit, temporarily fixing the shielding material 13 to the base tube 23.

Figure 3C:
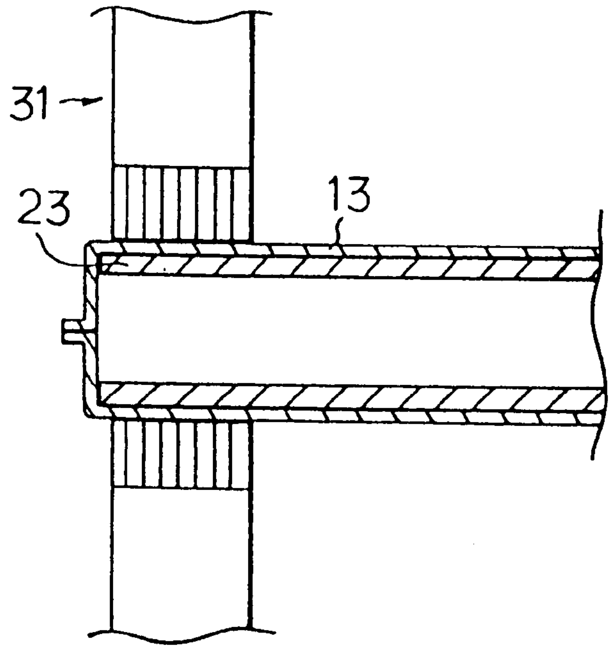
FIG. 3C is a representation of the coating means.

The shielding material 16 and base tube 23 assembly is then passed through a coating means 31 as illustrated in FIG. 3C. The coating means consists of a sponge, brush or the like which is supplied with an adhesive. The internal surface of the heat shrinkable tube 11 is also coated with adhesive by means of a liquid adhesive spray.

Figure 3D:
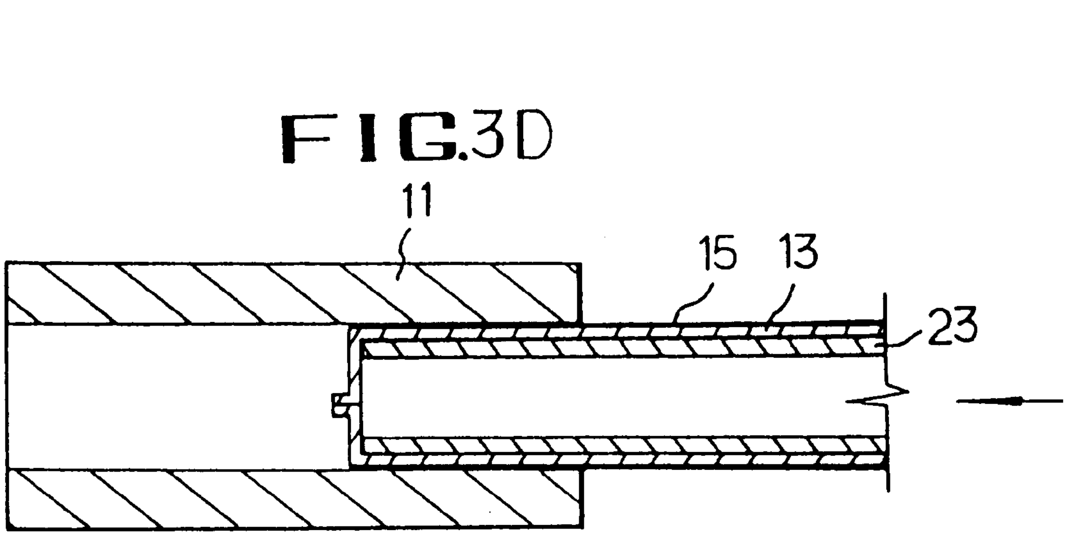
FIG. 3D is a representation of the insertion step.
Figure 3E:
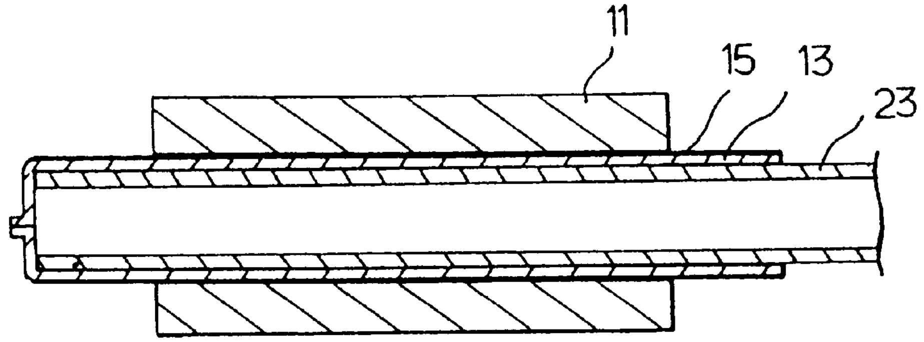
FIG. 3E further depicts the insertion step.
Figure 3F:
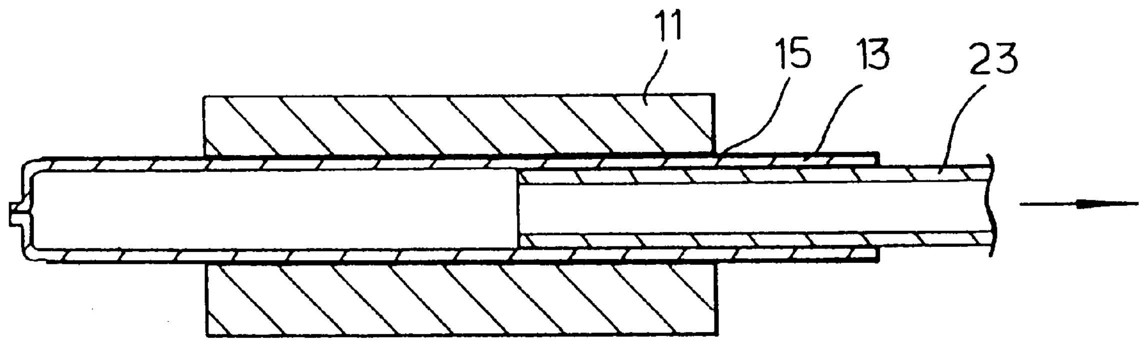
FIG. 3F is a representation the extraction step.

Next, the shielding material 16 and base tube 23 assembly is inserted completely through the heat shrinkable tube 11 as shown in FIGS. 3D and 3E. The entire tube assembly is then held by a holding means for a predetermined time until the adhesive has cured. Curing may be expedited by coating an adhesive on the shielding material and a curing agent on the tube (or vice versa) so that rapid cure occurs when they come in contact. Alternatively, a pressure sensitive adhesive may be used on the tube or sheet.

Once the shielding material 16 is tightly adhered to the heat shrinkable tube 11, the base tube 23 is smoothly removed from inside of the heat shrinkable tube 11 because the shielding material 13 is securely attached to the inside surface of the heat shrinkable tube 11.

Figure 3G:
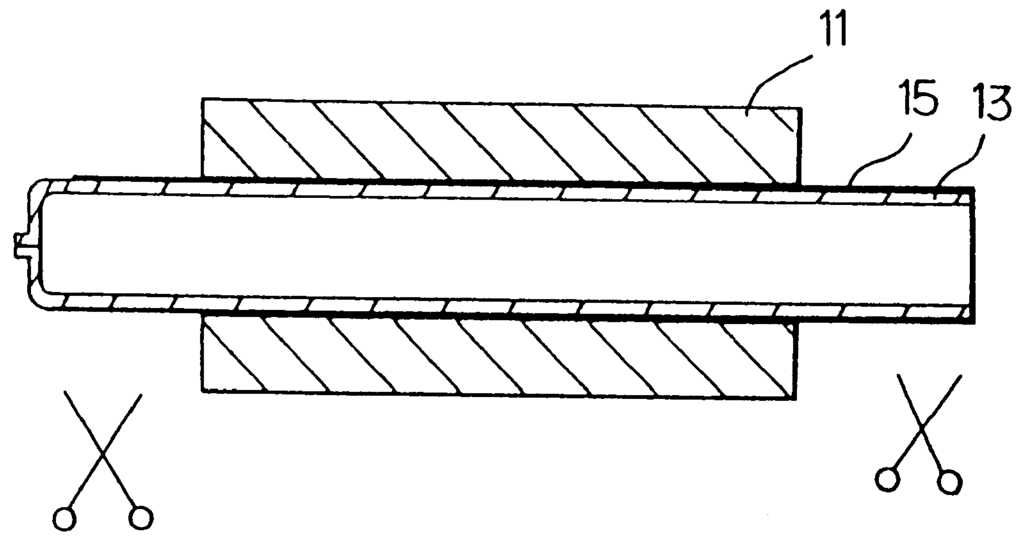
FIG. 3G is a representation of the finishing or cutting step.

Finally, as illustrated in FIG. 3G, the ends of the shielding material 13 protruding from the front and rear ends of the heat shrinkable tube 11 are cut flush with the ends of the heat shrinkable tube 11, so that a heat shrinkable shielding tube can be obtained, as illustrated in FIG. 1A.

The present invention provides an outstanding heat shrinkable shielding tube which can be easily manufactured through a series of processes. Compared with a construction where the electromagnetic shielding material is spirally and overlappingly wound on an electric wire, the heat shrinkable shielding tube according to the present invention provides simple manufacturing steps, low production costs and effective in shielding the electromagnetic radiation.

Those skilled in the art will recognize modifications and substitutes to the elements of the embodiments described herein. For example, although described in a process for making electrically shielded heat shrinkable tubing in predetermined lengths, it will be apparent that a conductive fabric or other shielding can be curled into a tubular shape, provided with a longitudinal stripe of adhesive and introduced into a heat shrinkable tube in a continuous process for making tubing of indefinite length. One may choose to place a plurality of adhesive stripes between the inside of the tube and the electromagnetic shielding. A flexible conductive fabric between such stripes may buckle and fold upon shrinkage of the tube.

Ordinarily the overlapped edges of the electromagnetic shielding material are not secured together, but if desired adhesive can be provided between the overlapped edges. If so, it is preferred to use an electrically conductive adhesive or cover less than the full width of the overlap so that there is continuous electrical shielding around the entire perimeter of the wires in the tube. Such modifications and substitutions are within the scope of the present invention as defined in the following claims.

What is claimed is:

1. A heat shrinkable shielding tube for encompassing electrical wires comprising:

an outer tube comprising a heat shrinkable material;

an inner shielding layer comprising a continuous metal layer extending around the entire internal circumference of the outer tube wherein the width of the metal layer is larger than the internal circumference of the outer tube;

wherein at least a portion of the metal layer directly contacts and crumples around the encompassed electrical wires;

an adhesive attaching the metal layer to the internal circumference of the outer tube; and wherein one longitudinal edge of the metal layer overlaps and is in electrically conducting contact with the other edge of the metal layer along the length of the outer tube.

2. A heat shrinkable shielding tube as recited in claim 1 wherein the metal layer comprises a metal foil coated with a semiconducting material on at least one side.

3. A heat shrinkable shielding tube as recited in claim 2 wherein the metal layer is formed into a seamed cylindrical tube.

4. A heat shrinkable shielding tube as recited in claim 2 wherein the metal layer is a metallized fabric.

5. A heat shrinkable shielding tube for encompassing electrical wires comprising:

an outer tube comprising a heat shrinkable material;

an inner shielding layer comprising a layer of electrically conductive material extending around the entire internal circumference of the outer tube, wherein one longitudinal edge of the inner shielding layer is folded over on itself to electrically contact the other longitudinal edge of the inner shielding layer;

wherein at least a portion of the inner shielding layer directly contacts and crumples around the encompassed electrical wires;

an adhesive attaching a portion of the inner shielding layer to the internal circumference of the outer tube, leaving another portion of the inner shielding layer unattached to the interior of the outer tube; and wherein the shielding layer forms the inner surface of the outer tubes.

* * * * *